United States Patent
Sadeghian Marnani et al.

(10) Patent No.: US 10,775,405 B2
(45) Date of Patent: Sep. 15, 2020

(54) METHOD OF AND SYSTEM FOR PERFORMING DEFECT DETECTION ON OR CHARACTERIZATION OF A LAYER OF A SEMICONDUCTOR ELEMENT OR SEMI-MANUFACTURED SEMICONDUCTOR ELEMENT

(71) Applicant: Nederlandse Organisatie voor toegepast-natuurwetenschappelijk onderzoek TNO, 's-Gravenhage (NL)

(72) Inventors: Hamed Sadeghian Marnani, The Hague (NL); Maarten Hubertus van Es, Voorschoten (NL); Rutger Meijer Timmerman Thijssen, Loosdrecht (NL)

(73) Assignee: Nederlandse Organisatie voor toegepast-natuuurwetenschappelijk onderzoek TNO, 's-Gravenhage (NL)

( * ) Notice: Subject to any disclaimer, the term of this patent is extended or adjusted under 35 U.S.C. 154(b) by 44 days.

(21) Appl. No.: 16/329,094

(22) PCT Filed: Aug. 31, 2017

(86) PCT No.: PCT/NL2017/050575
§ 371 (c)(1),
(2) Date: Feb. 27, 2019

(87) PCT Pub. No.: WO2018/044167
PCT Pub. Date: Mar. 8, 2018

(65) Prior Publication Data
US 2019/0227097 A1 Jul. 25, 2019

(30) Foreign Application Priority Data
Aug. 31, 2016 (EP) ..................................... 16186518

(51) Int. Cl.
*G01Q 20/00* (2010.01)
*H01L 21/66* (2006.01)
(Continued)

(52) U.S. Cl.
CPC ............. *G01Q 20/00* (2013.01); *G01N 29/00* (2013.01); *G01N 29/041* (2013.01);
(Continued)

(58) Field of Classification Search
CPC ........ G01Q 20/00; G01Q 60/32; G01N 29/00; G01N 29/041; G01N 29/0681; G01N 2291/0427; G01N 2291/2697; G01L 22/12
See application file for complete search history.

(56) References Cited

U.S. PATENT DOCUMENTS

2004/0200575 A1 10/2004 Bietsch et al.
2006/0037401 A1 2/2006 Shekhawat et al.
(Continued)

OTHER PUBLICATIONS

Yamanaka et al., "Ultrasonic Force Microscopy for Nanometer Resolution Subsurface Imaging," Applied Physics Letters, vol. 64, No. 2, pp. 178-180, XP000416816 (Jan. 10, 1994).
(Continued)

*Primary Examiner* — Nicole M Ippolito
*Assistant Examiner* — Hanway Chang
(74) *Attorney, Agent, or Firm* — Leydig, Voit & Mayer, Ltd.

(57) ABSTRACT

The present document relates to a method of performing defect detection on a self-assembled monolayer of a semiconductor element or semi-manufactured semiconductor element, using an atomic force microscopy system. The system comprises a probe with a probe tip, and is configured for positioning the probe tip relative to the element for enabling contact between the probe tip and a surface of the
(Continued)

element. The system comprises a sensor providing an output signal indicative of a position of the probe tip. The method comprises: scanning the surface with the probe tip; applying an acoustic vibration signal to the element; obtaining the output signal indicative of the position of the probe tip; monitoring probe tip motion during said scanning for mapping the surface of the semiconductor element, and using a fraction of the output signal for mapping contact stiffness indicative of a binding strength.

15 Claims, 6 Drawing Sheets

(51) Int. Cl.
    *G01N 29/04* (2006.01)
    *G01N 29/06* (2006.01)
    *G01Q 60/32* (2010.01)
    *G01N 29/00* (2006.01)

(52) U.S. Cl.
    CPC ......... *G01N 29/0681* (2013.01); *G01Q 60/32* (2013.01); *H01L 22/12* (2013.01); *G01N 2291/0427* (2013.01); *G01N 2291/2697* (2013.01)

(56) References Cited

U.S. PATENT DOCUMENTS

2008/0276695 A1    11/2008    Prater et al.
2011/0231965 A1    9/2011    Passian et al.

OTHER PUBLICATIONS

Dinelli et al., "Mapping Surface Elastic Properties of Stiff and Compliant Materials on the Nanoscale Using Ultrasonic Force Microscopy," Coordination Chemistry Reviews, vol. 80, No. 10, pp. 2299-2323, XP008068616 (Oct. 1, 2000).

Skilbeck et al., "Multimodal Microscopy Using 'half and half' Contact Mode and Ultrasonic Force Microscopy," Nanotechnology, vol. 25, No. 33, p. 335708, XP020268737 (Jul. 30, 2014) (8 pages).

Dinelli et al., "Ultrasonic Force Microscopy: Detection and Imaging of Ultra-Thin Molecular Domains," Ultramicroscopy, vol. 111, No. 4, pp. 267-272, XP028153009 (Dec. 28, 2010).

European Patent Office, International Search Report in corresponding International Application No. PCT/NL2017/050575, dated Dec. 1, 2017 (4 pages).

METHOD OF AND SYSTEM FOR PERFORMING DEFECT DETECTION ON OR CHARACTERIZATION OF A LAYER OF A SEMICONDUCTOR ELEMENT OR SEMI-MANUFACTURED SEMICONDUCTOR ELEMENT

CROSS-REFERENCE TO RELATED APPLICATIONS

This patent application is a U.S. National Phase of PCT International Application No. PCT/NL2017/050575, filed Aug. 31, 2017, which claims priority to European Application No. 1618651803, filed Aug. 31, 2016, which are both expressly incorporated by reference in their entireties, including any references contained therein.

FIELD OF THE INVENTION

The present invention is directed at a method of performing defect detection on or characterization of a layer of a semiconductor element or semi-manufactured semiconductor element, the layer being a self-assembled monolayer or a directed self-assembled layer. The invention is further directed at a method of manufacturing a semiconductor element or semi-manufactured semiconductor element, and at an atomic force microscopy system.

BACKGROUND

With the ongoing miniaturization of semiconductor elements to achieve even faster chips, higher processing capability, and broader fields of application, the manufacturing thereof becomes more an more challenging. Conventional manufacturing methods such as lithographic methods are approaching the boundaries of what is achievable in view of the desired dimensions. Therefore, other technologies are being explored that enable to further decrease the scale of dimensions at which semiconductor elements may be manufactured.

Promising technologies that may be applied on a large scale in the future for manufacturing semiconductor elements, include selective etching and selective atomic layer deposition methods, as well as the use of directed self-assembly (DSA) for patterning. In particular implementations of this technology, a self-assembled monolayer (SAM) may be applied as a mask. For example, in case of selective etching the SAM may prevent etching to take place, except for those areas wherein the SAM is interrupted by a void or opening in the monolayer. By pattering such openings in the SAM, selective etching may be performed to form device structures in the material underneath the semiconductor element.

Although the above technique works very well in creating ingenious two dimensional and three dimensional semiconductor device structures of very small dimensions (below 20 nanometer), the technology is prone to defects in the self-assembled monolayer or directed self-assembled layer. A self-assembled monolayer is a very fragile monolayer of molecules that may be 1 or 2 nanometers of size. If a single molecule is missing, this will create a defect of at least this size. Directed self-assembled layers are likewise fragile and prone to missing molecules that may interfere with their application, e.g. in a patterning process. For this reason, to prevent critical defects in the semiconductor elements created, inspection of the self-assembled monolayer or directed self-assembled layers (DSA) is to be performed to check for undesired pinholes and for delamination or weaknesses in binding strength of the SAM or DSA to the material underneath.

SUMMARY OF THE INVENTION

It is an object of the present invention to provide method of performing defect detection on or characterization of a self-assembled monolayer or a directed self-assembled layer of a semiconductor element or semi-manufactured semiconductor element, which method is time efficient and accurate such as to be suitable for application in a manufacturing process.

To this end, there is provided herewith a method of performing defect detection on or characterization of a layer of a semiconductor element or semi-manufactured semiconductor element, the layer being a self-assembled monolayer or a directed self-assembled layer the method being performed using an atomic force microscopy system, wherein system comprises a probe with a probe tip, and wherein the system is configured for positioning the probe tip relative to the semiconductor element for enabling contact between the probe tip and a surface of the semiconductor element for performing said defect detection, wherein the system further comprises a sensor for sensing a position of the probe tip and for providing an output signal, the method comprising: scanning the surface of the semiconductor element with the probe tip; and wherein the method further comprises the steps of: applying, using a transducer, an acoustic vibration signal to the semiconductor element; obtaining, from the sensor, the output signal indicative of the position of the probe tip during said scanning; monitoring probe tip motion during said scanning for mapping the surface of the semiconductor element, and using a second fraction of the output signal for mapping a position dependent contact stiffness indicative of a binding strength at a measurement depth below the surface of the semiconductor element, and wherein the second fraction of the output signal at least includes output signal components having a frequency above a second frequency. Any surface defects are detected by the monitoring of the probe tip motion that enables to map the surface of the semiconductor element.

The present invention combines an atomic force microscopy (AFM) method with an ultrasonic force microscopy (UFM), or a heterodyne force microscopy (HFM), or other atomic force acoustic microscopy method to simultaneously perform binding strength measurements and surface topography mapping for performing said characterization of or defect detection on a self-assembled monolayer or directed self-assembled layer of a semiconductor element. To achieve this, the present invention performs AFM by scanning the surface of the element with a probe, while additionally applying an acoustic vibration signal to the semiconductor element using a transducer. A first fraction of an output signal obtained by monitoring probe tip motion, e.g. a low frequency fraction, is used to provide the information required for surface topography mapping. From this information, a regular AFM surface image may be formed, and the information is sufficiently accurate to identify missing molecules in the self-assembled monolayer that form the pinholes which later may create defects during an etching or deposition step. A second fraction of the output signal which includes high frequency components, is analyzed for providing contact stiffness information. This contact stiffness information directly relates to the elasticity below the surface, which is thereby indicative of the binding strength at the measurement depth considered. Additionally, the method even enables to detect defects below the surface, due to the combination of measurement techniques.

Therefore, the present detection method enables to simultaneously monitor the binding strength of the self-assembled monolayer and detect pinholes or missing molecules therein, or defects below the surface. The method may be performed at high throughput. This enables to fit in the defect detection method of the present invention into high throughput batch processes for manufacturing semiconductor elements by means of selective etching or selective deposition using self-assembled monolayers.

In accordance with various embodiments, the step of monitoring the probe tip motion for mapping the surface of the semiconductor element comprises at least one of: using a first fraction of the output signal, wherein the first fraction of the output signal at least includes output signal components having a frequency below a first frequency; or using a feedback signal indicative of height corrections of the probe tip relative to the surface of the semiconductor element; or obtaining, using a z-level sensor, height measurements of the height of the probe tip relative to the semiconductor surface. For example, an analyzer system or control system analyzes a first fraction of the output signal which includes low frequency (and also DC or static) signal components, to obtain the required information for performing surface topography mapping. Moreover, such information may be obtained from a feedback signal that controls the height of the scan head or the probe above the surface and from which height corrections may be obtained. Another option is to use an additional z-level sensor to measure the height of the probe or the height corrections. There are various possible implementations that enable to obtain this information.

The method of the present invention even enables to set the measurement depth which the subsurface measurements providing the contact stiffness information is obtained. For example, in accordance with an embodiment of the present invention, the method further includes a step of controlling a setpoint force of the system for controlling the measurement depth, wherein the setpoint force is indicative of a force applied by the probe tip to the surface, and wherein an increase of the setpoint force causes the measurement depth to increase, whereas a decrease of the setpoint force causes the measurement depth to decrease. The setpoint force is the force that is applied by the probe tip to the surface, and may be controlled by operating the atomic force microscope in feedback mode, e.g. by applying a feedback controller such as a proportional-integral-differential feedback controller. By increasing the setpoint force, the depth at which information is obtained may be increased. In fact, when at a specific position of the probe tip relative to the surface the setpoint is modified such as to be set at a number of setpoint force values across a range, analysis of the output signal (in particular the second fraction thereof) enables to find the setpoint force value that corresponds to a measurement depth associated with the interface between the self assembled monolayer and the material underneath. Therefore, prior to scanning of the surface of the semiconductor elements, the setpoint force can be tuned to a specific setpoint force value corresponding to the measurement that associated with the interface, such as to enable binding strength analysis of the binding strength between the self assembled monolayer and the underlying semiconductor material. This may be performed with or without tuning of the modulation frequency, as will be explained further down below. In accordance with a further embodiment, the acoustic vibration signal comprises a carrier wave signal having a carrier frequency and a modulation signal having a modulation frequency. Here, upon controlling the setpoint force, the modulation frequency may be controlled such as to optimize an output signal strength of the output signal. This may be performed optionally in combination with the tuning of the setpoint force value as explained above. The tuning of the modulation frequency to the setpoint force is based on the insight that by changing the setpoint force value, the contact resonance frequency also changes. The contact resonance frequency at a certain setpoint may for example be found by sweeping the modulation frequency across a plurality of modulation frequency values, and monitoring the demodulation amplitude or demodulation phase of the output signal. For example, by performing a frequency sweep of the modulation frequency at a plurality of setpoint force values, at finding a modulation frequency for which the amplitude response is at its maximum value (or alternatively or additionally the modulation frequency for which the phase indicates a resonance mode), the optimal modulation frequency associated with each setpoint force value may be found. Therefore, in accordance with an embodiment of the present invention, wherein the acoustic vibration signal comprises a carrier wave signal having a carrier frequency and a modulation signal having a modulation frequency, the method further comprises, at one or more positions of the probe tip relative to the semiconductor element, the steps of controlling a setpoint force such as to consecutively set the setpoint force at a plurality of setpoint force values, and performing, at each setpoint force value, a frequency sweep of the modulation frequency across a plurality of frequencies in a frequency range for associating an optimal modulation frequency with each setpoint force value. The above typically includes ultrasonic force microscopy (UFM). It is to be noted that the method may be performed in various kinds of UFM configurations. These further include, for example, force modulation microscopy and heterodyne force microscopy.

In yet a further embodiment of the present invention, the set point force is controlled such as to set the measurement depth to an interface region between the self assembled monolayer and a lower portion or layer of the semiconductor element, to enable simultaneous detection of surface defect and binding strength of the monolayer. In particular, in a preferred embodiment, the semiconductor element comprises at least one of a substrate or one or more device layers, wherein an upper layer of the semiconductor element is provided by the self-assembled monolayer, and wherein the method is performed to simultaneously detect surface defects in the self-assembled monolayer and map a position dependent contact stiffness indicative of a binding strength of the self-assembled monolayer to the semiconductor device.

In some embodiments of the present invention, the method further comprises at least one of the steps of: low pass filtering of the output signal for providing the first fraction; or high pass filtering of the output signal for providing the second fraction. In this embodiment, a low pass filter and a high pass filter in the control system or analyzer system of the atomic force microscope separate the first fraction from the output signal at the second fraction of the output signal for individual analysis thereof. For example, a low pass filter and a beginning of a first branch of the control system allows to only pass through the low frequency components, including the static or DC components of the output signal. As may be appreciated the surface topography information particularly can be found by analyzing these low frequency portions of the output signal. This is because changes in the deflection of the probe tip caused by height differences of the surface are found to change proportional to the speed of scanning of the probe relative to the surface. Therefore, the majority of information for the surface topography measurements can be found in the low frequency proportions of the output signal. Although the threshold frequency of the low pass filter for providing the first fraction of the output signal is not very critical. However, the threshold value for the low pass filter may be set slightly higher than the sampling rate to be fast enough with respect to the scanning speed and sampling by the AFM (e.g. for sampling rate of 1024 pixels per second, corresponding to 1.024 kHz, a cut off frequency for the low pass filter may be 2 kHz). Taking the above in consideration, a typical range for the cut off frequency of the low pass filter may be a threshold frequency being larger than the sampling rate up to e.g. five times the sampling rate. However, as mentioned, the specific threshold frequency selected for the low pass filter is not very critical and may be different than indicated above.

For the high pass filter, a similar threshold frequency of cut off frequency may be used, enabling to pass through any signal component having a frequency above this cut off frequency. For example, considering the abovementioned cut off frequency of 2 kHz for the low pass filter, also the high pass filter may be set at a cut off frequency 2 kHz. The cut off frequency of the high pass filter should at least be lower than the modulation frequency of the acoustic vibration signal. Preferably, the acoustic vibration signal consists of an ultrasonic signal and a modulation signal. The ultrasonic signal may for example be in the MHz-range (megahertz range) whereas the modulation signal will be approximately the probe cantilever resonance frequency, thereby being the kHz-range (kilohertz range). Typical resonance frequencies of the probe may be within a range of 300 kHz to 1700 kHz, preferably 500 kHz to 1500 kHz, more preferable 500 kHz to 1000 kHz. By setting the cut off frequency of the high pass filter to 2 kHz, the low frequency components are removed and all high frequency components (including higher vibrational modes) are passed through. Instead of 2 kHz, the cut off frequency of the high pass filter may typically range starting from the cut off frequency of the low pass filter to 300 kHz. However, the upper boundary of the range may even be larger, e.g. up to 75% of the expected resonance frequency of the probe cantilever. In accordance with yet another embodiment of the invention, the step of applying the acoustic vibration signal to the semiconductor element is performed by at least one of: applying, by the transducer via the probe, the acoustic vibration signal via the probe tip; or applying, by the transducer, the acoustic vibration signal directly to the semiconductor element, such as via at least one of: a contact surface located underneath the semiconductor element, an upper side of the semiconductor element, or the side of the semiconductor element. In fact, this includes two particular embodiments; one wherein the acoustic vibration signal is applied to the semiconductor element via the probe, and one wherein the acoustic vibration signal is directly applied to the semiconductor element. Applying the acoustic vibration signal via the probe may, occasionally, provide a better signal to noise ratio in the output signal sensed by the sensor of the AFM system. This may be due to the fact that the probe tip may be properly shaped during development thereof such as to provide the probe tip to be responsive to a plurality of frequencies (rather than having a particular resonance frequency). As explained above, the resonance frequency is also dependent on the setpoint force value set in the AFM for the particular measurement, however as may be appreciated a combination of proper shaping of the probe tip and the setpoint force dependence of the resonance frequency may beneficially influence the signal to noise ratio. On the other hand, in the embodiments wherein the acoustic vibration signal is directly applied to the semiconductor element, e.g. by mounting a transducer underneath the semiconductor element or to the side or upper surface thereof, a good cupping between the transducer and the semiconductor element positively influences the signal to noise ratio in these embodiments.

In accordance with a second aspect of the present invention there is provided a method of manufacturing a semiconductor element or semi-manufactured semiconductor element, comprising the steps of depositing a self-assembled monolayer onto at least one of a substrate or one or more device layers, and performing a method according to any of the claims 1-8 for defect detection on the self-assembled monolayer using an atomic force microscopy system, wherein system comprises a probe with a probe tip, and wherein the system is configured for positioning the probe tip relative to the semiconductor element for enabling contact between the probe tip and a surface of the semiconductor element for performing said defect detection, wherein the system further comprises a sensor for sensing a position of the probe tip and for providing an output signal, the method comprising: scanning the surface of the semiconductor element with the probe tip; and wherein the method further comprises the steps of: applying, using a transducer, an acoustic vibration signal to the semiconductor element; obtaining, from the sensor, the output signal indicative of the position of the probe tip during said scanning; using a first fraction of the output signal for mapping the surface of the semiconductor element for detecting surface defects, and using a second fraction of the output signal for mapping a position dependent contact stiffness indicative of a binding strength at a measurement depth below the surface of the semiconductor element, wherein the first fraction of the output signal at least includes output signal components having a frequency below a first frequency, and wherein the second fraction of the output signal at least includes output signal components having a frequency above a second frequency.

In particular, in accordance with some embodiments of this second aspect, the method may further include a step of, after deposition and defect detection of the self-assembled monolayer, performing at least one of selective atomic layer deposition or selective etching for forming device structures of the semiconductor device.

In accordance with yet a third aspect of the present invention there is provided an atomic force microscopy system suitable for performing defect detection on a self-assembled monolayer of a semiconductor element or semi-manufactured semiconductor element, wherein system comprises a probe with a probe tip, and wherein the system is configured for positioning the probe tip relative to the semiconductor element for enabling contact between the probe tip and a surface of the semiconductor element for performing said defect detection, wherein the system further comprises a sensor for sensing a position of the probe tip and for providing an output signal, the system further comprising a scanning actuator for scanning the surface of the semiconductor element with the probe tip, a transducer for applying an acoustic vibration signal to the semiconductor element; and a control system for receiving an output signal from the sensor during said scanning, the output signal being indicative of the position of the probe tip during said scanning; the control system being arranged for using a first fraction of the output signal for mapping the surface of the semiconductor element for detecting surface defects, and for using a second fraction of the output signal for mapping a position dependent contact stiffness indicative of a binding strength at a measurement depth below the surface of the semiconductor element, wherein the first fraction of the output signal at least includes output signal components having a frequency below a first frequency, and wherein the second fraction of the output signal at least includes output signal components having a frequency above a second frequency.

In the present document, although many times reference is made defect detection in self-assembled monolayers (SAHs), the method may likewise be applied to directed self-assembled layers (DSAs) as mentioned already above. Therefore, anywhere in this document where reference is made to self-assembled monolayers (SAHs), the reader must bear in mind that the teaching likewise apply to directed self-assembled layers (DSAs) and that the both terms (SAM and DSA) may therefore be interchanged. Moreover, in addition to defect detection, the method also allows characterization of such layers.

BRIEF DESCRIPTION OF THE DRAWINGS

The invention will further be elucidated by description of some specific embodiments thereof, making reference to the attached drawings. The detailed description provides examples of possible implementations of the invention, but is not to be regarded as describing the only embodiments falling under the scope. The scope of the invention is defined in the claims, and the description is to be regarded as illustrative without being restrictive on the invention. In the drawings:

DETAILED DESCRIPTION

Figure 1:
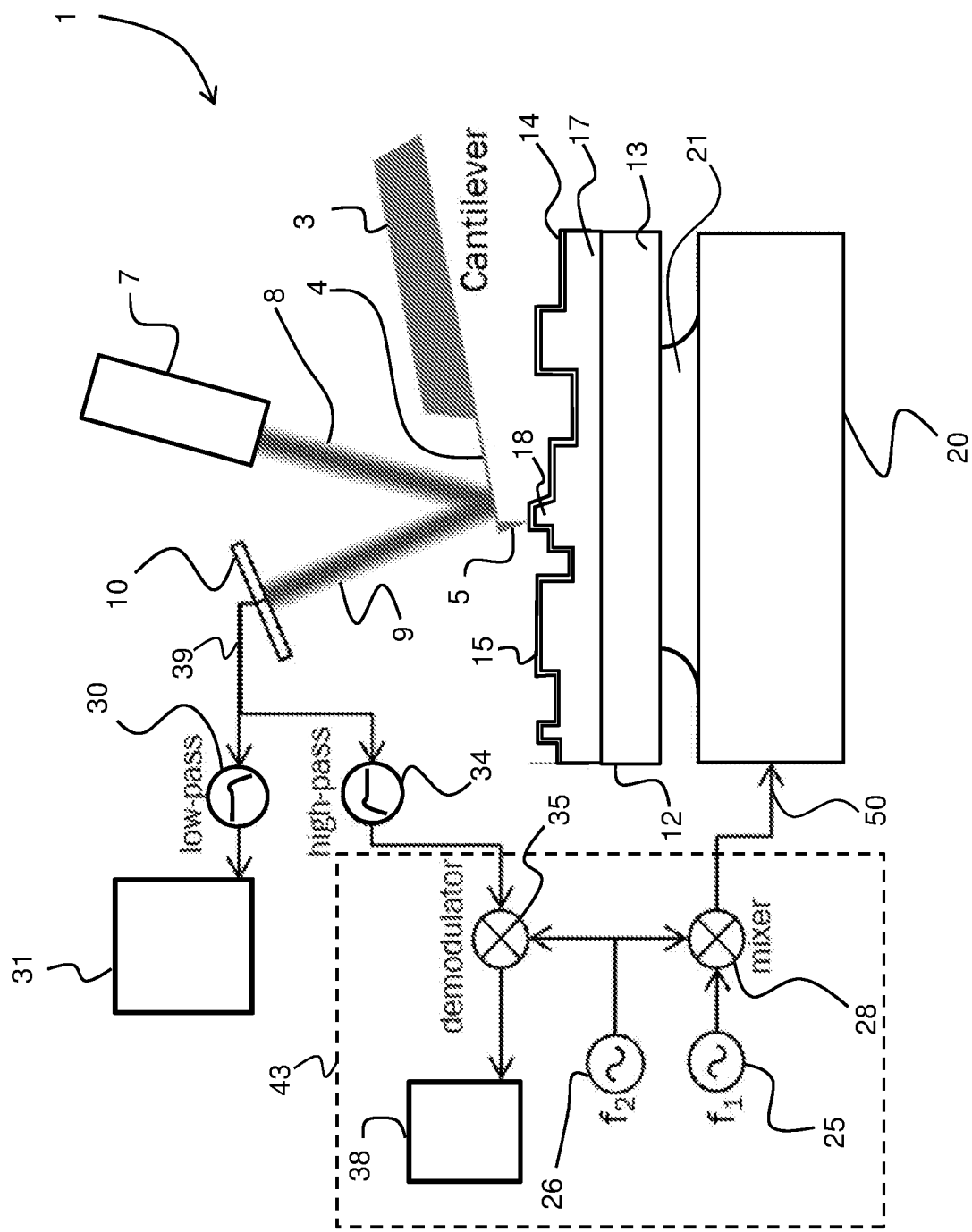
FIGS. 1 and 2 illustrate an atomic force microscope system including a semiconductor element performing the method of the present invention.
Figure 2:
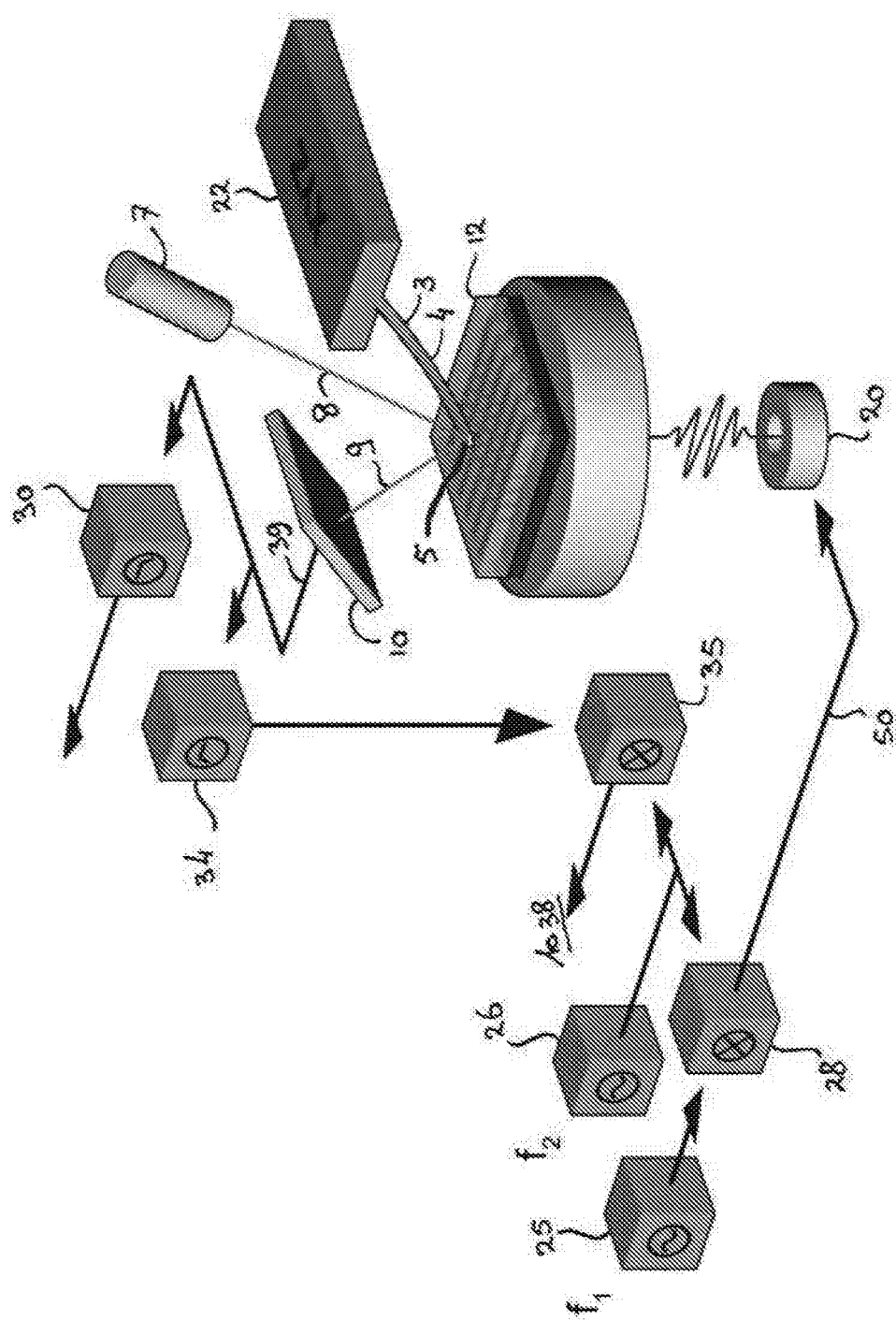

FIG. 1 schematically illustrates an atomic force microscopy system (AFM) 1, suitable for use in a method of the present invention and in accordance with an embodiment of the present invention. Another impression of the system 1 of FIG. 1 is illustrated in FIG. 2, reciting corresponding reference numerals. The system 1 comprises a probe 3 having a cantilever 4 and a probe tip 5. The probe tip 5 is brought in contact with a surface 15 of a self-assembled monolayer 14 on a semi-manufactured semiconductor element 12. A light source 7, typically a laser, provides an optical signal beam 8 that is incident on the back of the probe tip 5. A reflected optical beam 9 is received by an optical sensor 10. Any vibration of the probe tip 5 perpendicular to the surface 15 of the monolayer 14 will result in a deflection of the reflected optical beam 9. This deflection can be accurately determined by means of optical sensor 10 which provides an (electrical) output signal 39 for further analysis.

The defect detection method of the present invention applies, in addition to performing surface topography measurements, an acoustic vibration signal to the semiconductor element 12, which results in acoustic vibrations at the surface 15. These vibrations may be sensed by the probe tip 5 with great accuracy. In the system 1 of FIG. 1, a transducer 20 is arranged underneath the semiconductor element 12. A coupling medium 21 (e.g. a liquid, an oil or grease (e.g. vaseline)) provides a low resistance coupling between the acoustic transducer 20 and the semiconductor element 12. This allows an acoustic signal produced by the transducer 20 to penetrate the semiconductor element 12 from the back side thereof, e.g. in as in the set-up illustrated in FIG. 1. In respect of this, it is noted that it is not essential to the invention to apply the acoustic signal from the back side of the semiconductor element 12. The transducer 20 for applying the acoustic vibration signal may be located elsewhere relative to the semiconductor element 12, enabling the acoustic vibration signal to be applied from any desired direction (e.g. above, below, from aside, or even through another part or entity). In accordance with an embodiment which is discussed further down below in relation to FIG. 3, the acoustic vibration signal may also be applied using a transducer 70 mounted on or in connection with the probe tip 5 or probe 3.

The semiconductor element 12 in FIG. 1 consists of a substrate layer 13, and one or more optional device layers such as layer 17. The semiconductor element 12 in FIG. 1 is a semi-manufactured semiconductor element, thus it is being manufactured and may or may not receive additional layers later on. The device layer 17 comprises structures 18 (e.g. nanostructures) that are detectable as height variations at the surface 15. To later on during the manufacturing process enable to perform selective etching or selective deposition, self-assembled monolayer 14 covers layer 17 exposing surface 15 to the microscope system 1. As may be appreciated, the semiconductor element 12 illustrated in FIG. 1 (and also the semiconductor elements illustrated in other figures throughout this document) are merely examples.

The acoustic vibration signal 50 provided by transducer 20, after penetrating the semiconductor element 12, is conveyed through the layers 13, 17 and 14 producing acoustic vibrations at the surface 15. These can be sensed by the probe tip 5. By scanning the probe 3 relative to the surface 15, such that the probe tip 5 follows a path on the surface 15 of the semiconductor element 12, the surface topography of the semiconductor element 12 becomes measurable and may be mapped. There are various possibilities for obtaining this information. Primarily, by leading the output signal 39 through low-pass filter 30, the low frequency components of the output signal 39 may be provided to a feedback control system 31. This system 31 uses a proportional-integral-differential (PID) feedback controller 65 (see FIG. 3) and amplifier 66 (see FIG. 3) to control an AFM Z-piezo unit 23 (see FIG. 3) to maintain the probe tip at its setpoint force in feedback mode. This signal contains the desired information for performing surface topography mapping of the surface 15, and hence create an image of the surface 15 of monolayer 14. From the image or from the mapping data, defects such as missing molecules of the monolayer (i.e. pinholes) can be detected. This same information may alternatively or additionally also be obtained by including an additional Z-level sensor 53 (see FIG. 3) that directly determines the Z-distance of the probe head 22 (see FIG. 3) with respect to a fixed point (e.g. on the metrology frame). Hence, it is not essential to obtain the surface topography measurements from the first fraction of the output signal 39, including the low frequency components of the signal 39.

Figure 3:
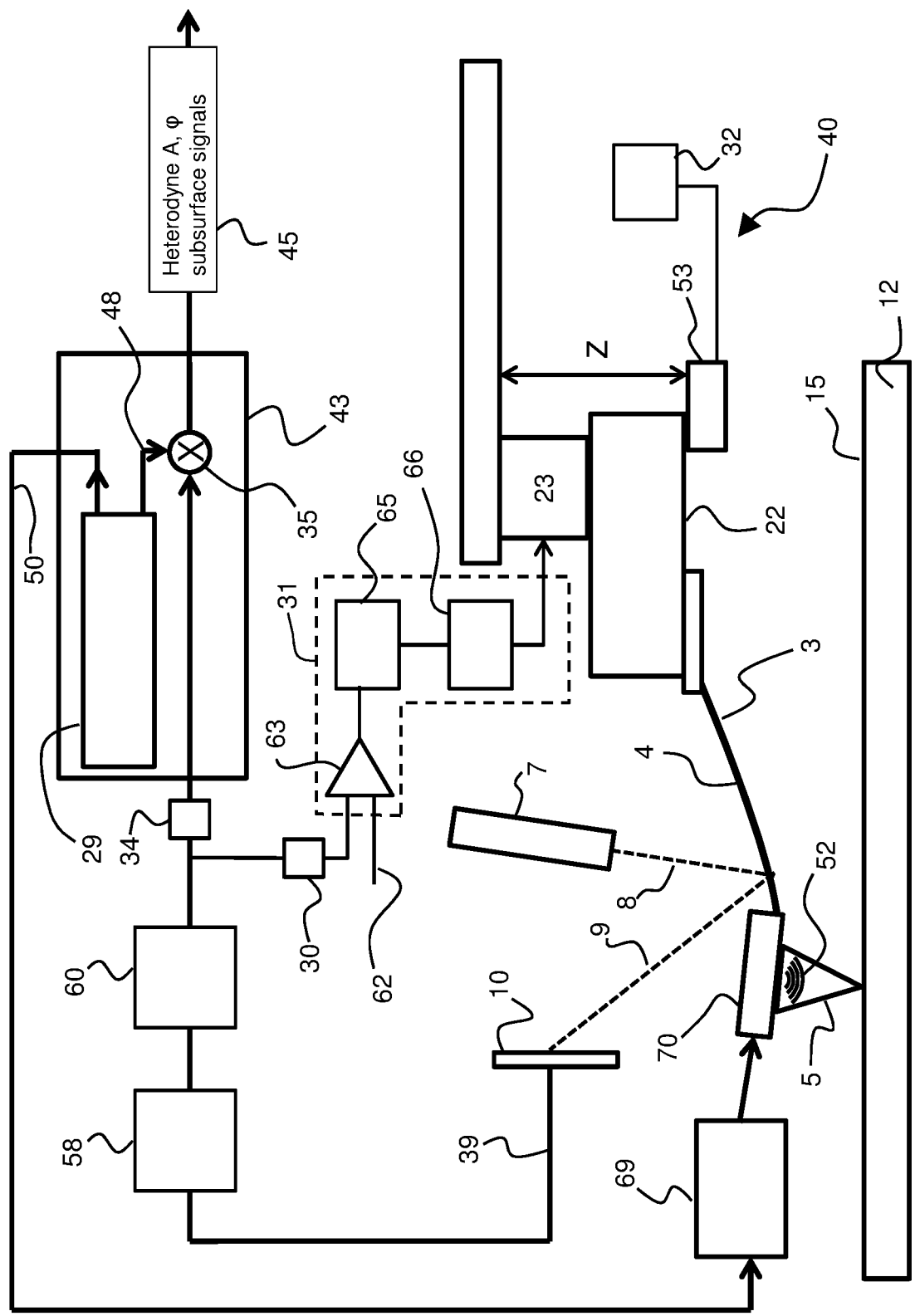
FIG. 3 illustrates a further embodiment of the invention, wherein acoustic vibrations are applied via a probe tip.

The acoustic vibration signal 50 to be provided via the transducer 20 to the semiconductor element 12 consists of a high frequency component $f_1$ and a low frequency component $f_2$, and is created as follows. One or more signal generators 29 comprise at least first frequency generator 25, a second frequency generator 26, and a signal mixer 28. A high frequency input signal component $f_1$ 25 and a low frequency input signal component $f_2$ 26 are mixed by mixer 28 and provided to the transducer 20. The transducer 20, via the coupling medium 21 (which in the present example may be Vaseline), sends the acoustic vibration signal into the substrate layer 13 of the semiconductor element 12. The sensor signal from optical sensor 10 is provided to a low-pass filter 30 for contact mode feedback, and the output of the low-pass filter 30 is sent to the feedback control system 31. The low pass filter has a cutoff frequency of, for example, around 2 kHz. This is fast enough with respect to the scanning speed, but only slightly higher than the sampling rate (e.g. 1024 pixels in 1 second corresponds to a sampling rate of 1.024 kHz). Feedback control system 31 uses the feedback signal to maintain the AFM system fixed at its setpoint force. The output signal 39 from the optical sensor 10 is further provided to a high-pass filter 34. The high pass filter 34 also has a cutoff frequency of, for example, around 2 kHz, thus thereby transmitting the second fraction of the output signal 39 including the high frequency ultrasound signal (i.e. including component $f_1$) and the low frequency modulation signal (i.e. including component $f_2$) to the demodulator 35. The demodulator 35 further receives the low frequency input signal $f_2$ 26 as a reference signal from the signal generator 29. An output signal of the demodulator 35 is provided to analysis system 38 which allows to analyze the location dependent ultrasound output signal to obtain the subsurface measurement information on the contact stiffness, for enabling binding strength analysis. Frequency generators 25 and 26, mixer 28, demodulator 35, and optionally analysis system 38 may form an integral system 43. In FIG. 3, further below, the frequency generators 25 and 26, the mixer 28, and the demodulator 35 are all part of a locking amplifier 43.

Figure 4:
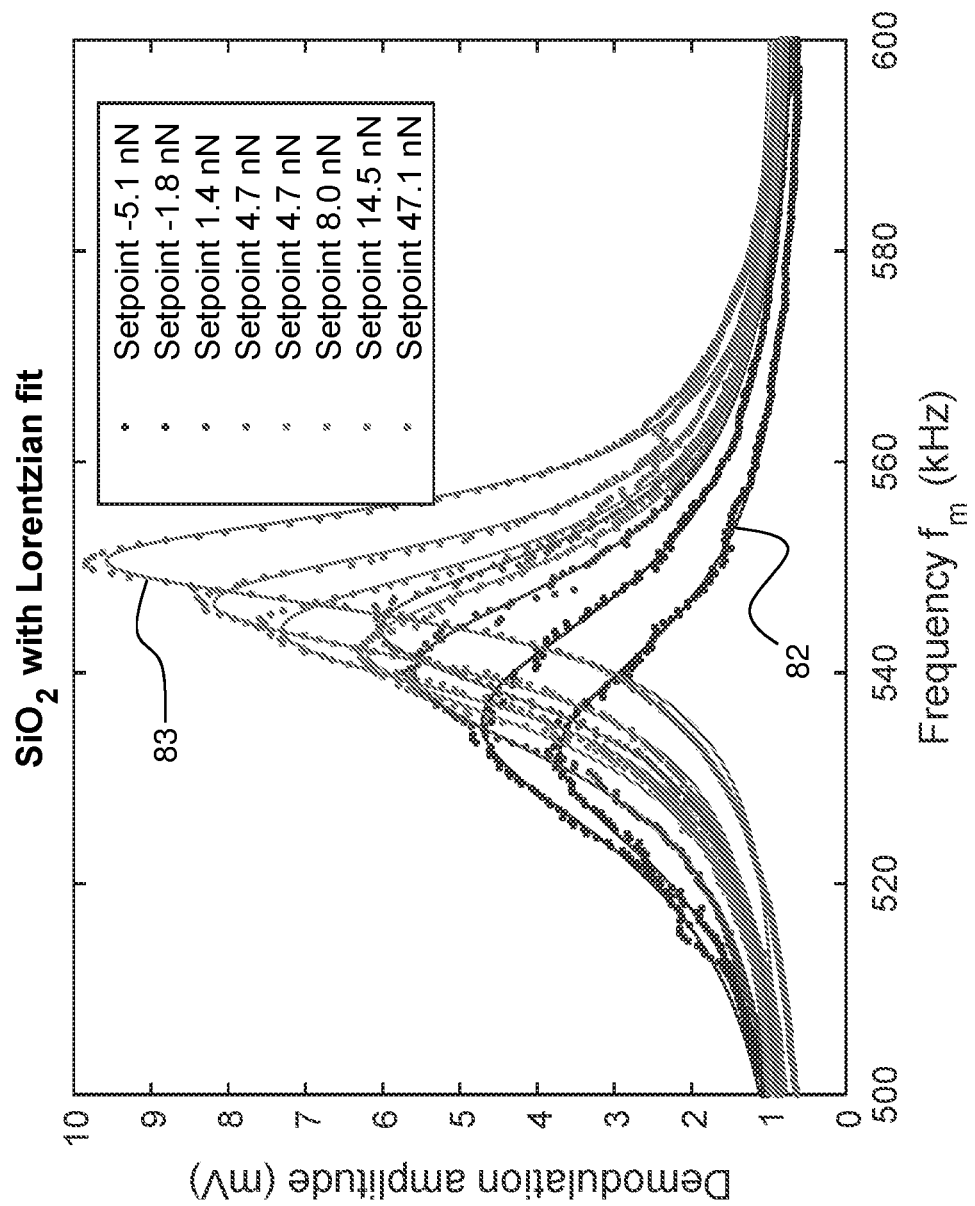
FIG. 4 illustrates frequency response characteristics at various setpoint force values, for tuning on the setpoint and the modulation frequency.
Figure 5A:
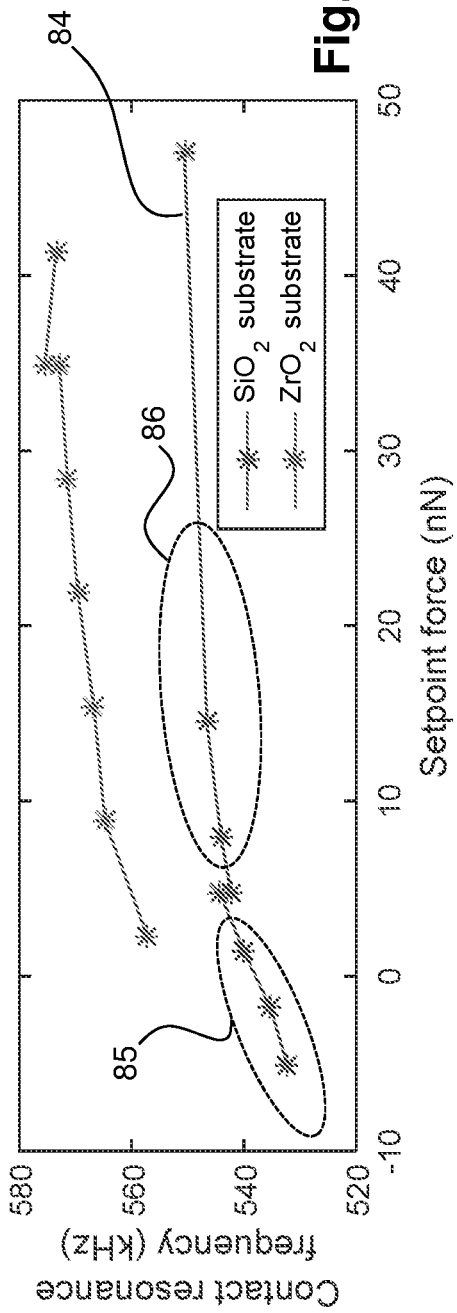
FIGS. 5A and 5B illustrate the contact resonance frequency and FWHM of the frequency response characteristic for determining a desired setpoint force value.
Figure 5B:
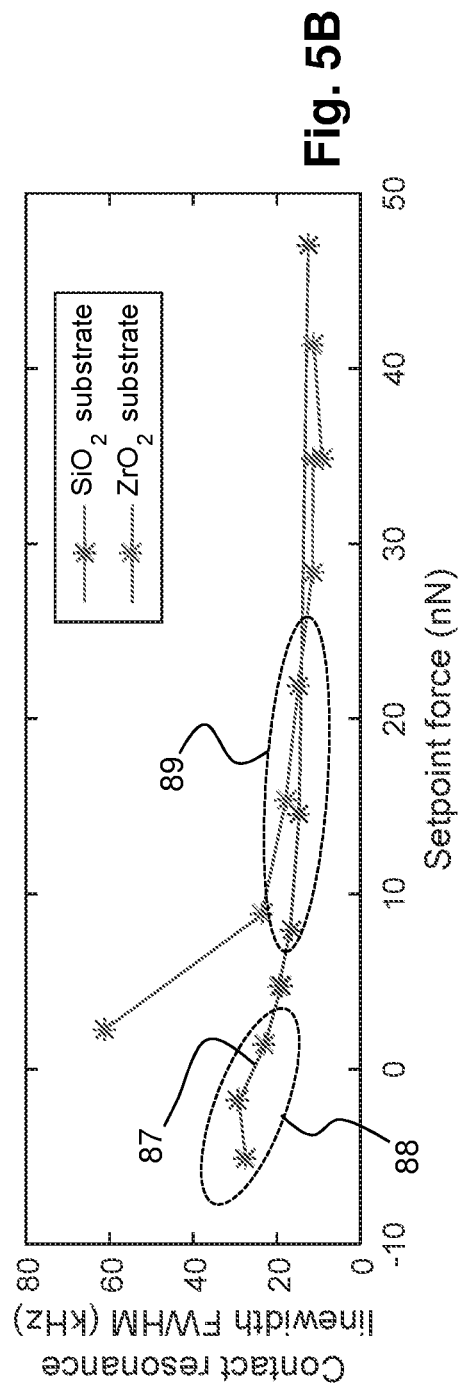

Herein above, is has been explained that by tuning of the setpoint force of the atomic force microscope, the measurement depth for performing binding strength measurements may be controlled. However, by changing the setpoint force, the response characteristic of the system also changes, resulting in the resonance frequency of the cantilever to shift. In FIG. 4, the demodulation amplitude (in milliVolt) has been plotted dependent on the modulation frequency fm (in kHz) for a silicon oxide (SiO2) semiconductor element for a plurality of setpoints. For each setpoint value (indicated in the upper right corner of the graph) a Lorentzian fit has been performed in order to determine the resonance frequency and the full width at half maximum (FWHM). Similar measurements have been obtained by using a zirconium oxide (ZrO2) semiconductor element (not shown in FIG. 4). In FIG. 4, the frequency response graph for the amplitude at the lowest measured setpoint force (setpoint force value equals −5.1 nN (nanoNewton)) is indicated by reference numeral 82. The corresponding resonance frequency at this setpoint value is approximately 533 kHz. The frequency response characteristic of the amplitude for the highest measured setpoint force (setpoint force value equals 47.1 nN) is indicated by reference numeral 83. The resonance frequency at this setpoint force value is approximately 551 kHz. As will be appreciated, once the setpoint force value has been tuned to provide information on the contact stiffness at a desired measurement depth, the modulation frequency f2 is preferably also tuned in order to obtain a sufficiently high signal-to-noise ratio. However, in accordance with a present invention it is also possible to analyze the shifting of the resonance frequency with changing setpoint force value in order to determine the setpoint force that corresponds to the desired measurement depth associated with the interface between the self-assembled monolayer 14 and the material layer 17 underneath. This is for example illustrated in FIGS. 5a and 5b. In FIG. 5a, the contact resonance frequency (kHz) dependent on the setpoint force (nN) is illustrated for the silicon oxide (SiO-2), semiconductor element and the zirconium oxide (ZrO-2), element. The curve 84 illustrates the resonance frequency for the silicon oxide substrate. In a first portion of the setpoint force value range, indicated by area 85, the contact resonance frequency is mainly determined by interaction with the surface of the semiconductor element. Further increasing of the setpoint force causes the contact resonance frequency curve to flatten, e.g. in the area 86. In this area, the response characteristic is also determined by the interface between the self-assembled monolayer and the layer underneath. Therefore, in order to analyze the binding strength of the self-assembled monolayer 14, the setpoint force may be tuned (for this substrate) to be somewhere between 9 and 25 nanoNewton. FIG. 5d shows a graph of the contact resonance line width, i.e. the full width at half maximum (FWHM) of the frequency response characteristic for the amplitude illustrated in FIG. 4. Curve 87 corresponds to the measurements performed with the silicon oxide substrate. Again, the first area 88 of the curve includes a portion which is mainly given by interaction with the surface 15 of the substrate. However, the FWHM rapidly decreases with increasing setpoint force, and in the area 89 the response characteristic is also governed by the deeper layers of the substrate, including the interface region between the self-assembled monolayer and the material underneath.

Figure 6A:
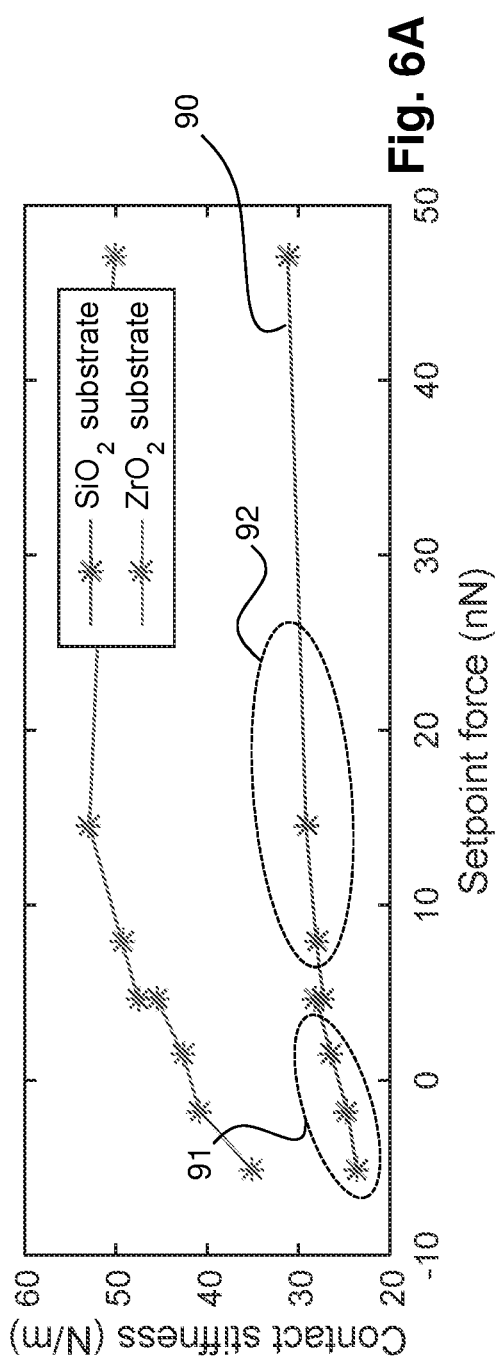
FIGS. 6A and 6B illustrate a measured contact stiffness and contact loss rate at various setpoint force values.
Figure 6B:
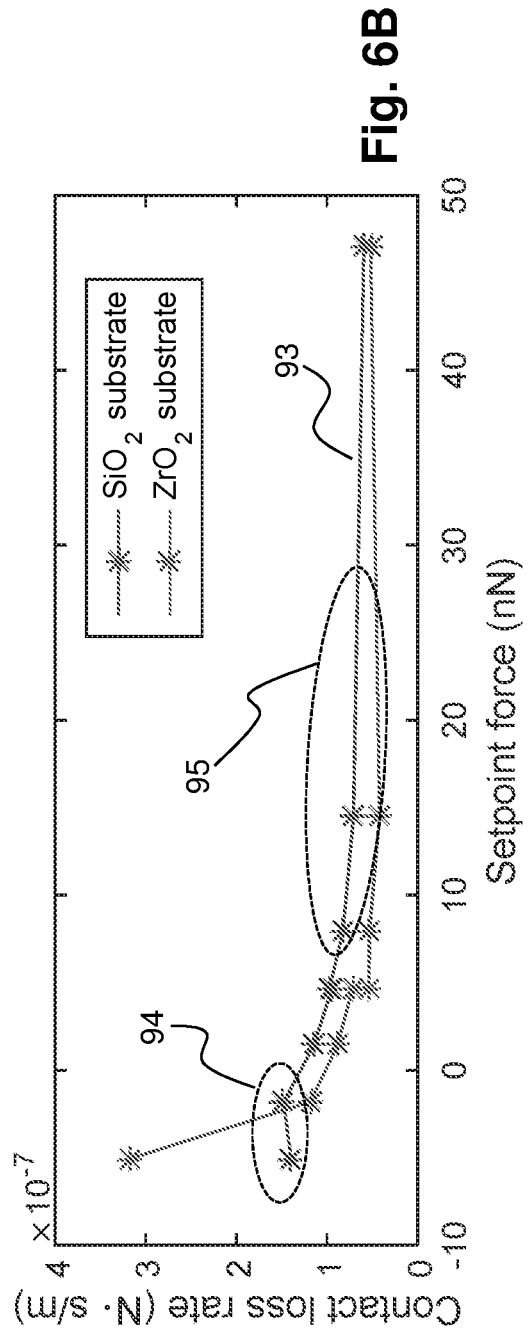

FIG. 6a illustrates the measured contact stiffness dependent on the setpoint force for the silicium oxide substrate and the zirconium oxide substrate. For the silicium oxide substrate, curve 90 provides the measured contact stiffness. The areas 91 and 92 illustrate the contact stiffness mainly governed by the surface 15 (area 91) and the contact stiffness including the interface between the self-assembled monolayer and the material underneath (area 92) respectively. FIG. 6b illustrates the measured contact loss rate dependent on the setpoint force for the silicium oxide substrate and the zirconium oxide substrate. The contact loss rate is defined by the dissipation energy of the sample due to its viscoelasticity. The higher the set point, the less effect can be seen. However, also, e.g. for the $SiO_2$ substrate, a clear difference is visible between areas 94 and 95 of curve 93.

The present invention has been described in terms of some specific embodiments thereof. It will be appreciated that the embodiments shown in the drawings and described herein are intended for illustrated purposes only and are not by any manner or means intended to be restrictive on the invention. It is believed that the operation and construction of the present invention will be apparent from the foregoing description and drawings appended thereto. It will be clear to the skilled person that the invention is not limited to any embodiment herein described and that modifications are possible which should be considered within the scope of the appended claims. Also kinematic inversions are considered inherently disclosed and to be within the scope of the invention. In the claims, any reference signs shall not be construed as limiting the claim. The term 'comprising' and 'including' when used in this description or the appended claims should not be construed in an exclusive or exhaustive sense but rather in an inclusive sense. Thus the expression 'comprising' as used herein does not exclude the presence of other elements or steps in addition to those listed in any claim. Furthermore, the words 'a' and 'an' shall not be construed as limited to 'only one', but instead are used to mean 'at least one', and do not exclude a plurality. Features that are not specifically or explicitly described or claimed may be additionally included in the structure of the invention within its scope. Expressions such as: "means for . . . " should be read as: "component configured for . . . " or "member constructed to . . . " and should be construed to include equivalents for the structures disclosed. The use of expressions like: "critical", "preferred", "especially preferred" etc. is not intended to limit the invention. Additions, deletions, and modifications within the purview of the skilled person may generally be made without departing from the spirit and scope of the invention, as is determined by the claims. The invention may be practiced otherwise then as specifically described herein, and is only limited by the appended claims.

The invention claimed is:

1. A method of performing a defect detection on or a characterization of a layer of a semiconductor element or a semi-manufactured semiconductor element, the layer being a self-assembled monolayer or a directed self-assembled layer, the method being performed using an atomic force microscopy system, wherein the system comprises a probe with a probe tip, and wherein the system positions the probe tip relative to the semiconductor element to enable contact between the probe tip and a surface of the semiconductor element for performing the defect detection on or the characterization of the semiconductor element, wherein the system further comprises a sensor for sensing a position of the probe tip and for providing an output signal, the method comprising:
scanning the surface of the semiconductor element with the probe tip; and
applying, using a transducer, an acoustic vibration signal to the semiconductor element;
obtaining, from the sensor, the output signal that is indicative of the position of the probe tip during said scanning, the output signal including a first fraction and a second fraction; and
monitoring a probe tip motion during the scanning for mapping the surface of the semiconductor element, and using the second fraction of the output signal for mapping a position dependent contact stiffness indicative of a subsurface elasticity and thereby indicative of a binding strength at a measurement depth below the surface of the semiconductor element, and
wherein the second fraction of the output signal at least includes an output signal components having a frequency above a threshold frequency of the second fraction.

2. The method according to claim 1, wherein the monitoring the probe tip motion during the scanning for mapping the surface of the semiconductor element comprises at least one of the group consisting of:
using the first fraction of the output signal, wherein the first fraction of the output signal at least includes output signal components having a frequency below a threshold frequency of the first fraction;

using a feedback signal indicative of a height correction of the probe tip relative to the surface of the semiconductor elements; and
obtaining, using a z-level sensor, a height measurement of a height of the probe tip relative to the surface of the semiconductor element.

3. The method according to claim 1, further including controlling a setpoint force of the system for controlling the measurement depth,
wherein the setpoint force is indicative of a force applied by the probe tip to the surface, and
wherein an increase of the setpoint force causes the measurement depth to increase, whereas a decrease of the setpoint force causes the measurement depth to decrease.

4. The method according to claim 3, wherein the acoustic vibration signal comprises an ultrasonic signal having a ultrasound frequency and a modulation signal having a modulation frequency,
wherein, upon controlling of the setpoint force, the modulation frequency is controlled to optimize an output signal strength of the output signal.

5. The method according to claim 3, wherein the setpoint force is controlled to set the measurement depth to an interface region between the self-assembled monolayer and a lower portion or further layer of the semiconductor element, to enable simultaneous detection of surface defects and binding strength of the monolayer.

6. The method according to claim 1, wherein the acoustic vibration signal comprises an ultrasonic signal having an ultrasonic frequency and a modulation signal having a modulation frequency, the method further comprising performing, at one or more positions of the probe tip relative to the semiconductor element:
controlling a setpoint force such as to consecutively set the setpoint force at a plurality of setpoint force values, wherein different setpoint forces are associated with different measurement depths, and
performing, at each setpoint force value, a frequency sweep of the modulation frequency across plurality of frequencies in a frequency range to establish an optimal modulation frequency with each setpoint force value.

7. The method according to claim 1, wherein the semiconductor element comprises at least one of the group consisting of; a substrate, and one or more device layers,
wherein an upper layer of the semiconductor element is provided by the self-assembled monolayer, and
wherein the method is performed to simultaneously detect surface defects in the self-assembled monolayer and map a position dependent contact stiffness indicative of a binding strength of the self-assembled monolayer to the semiconductor device.

8. The method according to claim 1, wherein the step of applying the acoustic vibration signal to the semiconductor element is performed by at least one of the group consisting of:
applying, by the transducer via the probe, the acoustic vibration signal via the probe tip; and
applying, by the transducer, the acoustic vibration signal directly to the semiconductor element.

9. An atomic force microscopy system suitable for performing a defect detection on or a characterization of a self-assembled monolayer of a semiconductor element or semi-manufactured semiconductor element, wherein the system comprises a probe with a probe tip, and wherein the system positions the probe tip relative to the semiconductor element to enable contact between the probe tip and a surface of the semiconductor element for performing the defect detection on or the characterization of the semiconductor element;
    a sensor that senses a position of the probe tip and an output signal;
    a scanning actuator that scans the surface of the semiconductor element with the probe tip;
    a transducer that applies an acoustic vibration signal to the semiconductor element; and
    a control system for receiving an output signal from the sensor, during a scanning by the scanning actuator, the output signal being indicative of a position of the probe tip during the scanning;
    wherein the control system uses a first fraction of the output signal to map the surface of the semiconductor element for the characterization or the detection of surface defects, and uses a second fraction of the output elasticity of thereby indicative of binding strength at a measurement depth below the surface of the semiconductor element,
    wherein the first fraction of the output signal at least includes output signal components having a frequency below a threshold frequency of the first fraction, and
    wherein the second fraction of the output signal at least includes output signal components having a frequency above a threshold frequency of the second fraction.

10. The atomic force microscopy system according to claim 9, wherein the control system comprises a feedback controller operatively connected thereto, such as a proportional-integral-differential feedback controller, for controlling a setpoint force of the system for controlling the measurement depth, wherein the setpoint force is indicative of a force applied by the probe tip to the surface.

11. The atomic force microscopy system according to claim 9, wherein the transducer provides the acoustic vibration signal that comprises an ultrasonic signal having a ultrasound frequency and a modulation signal having a modulation frequency,
    wherein the control system is further arranged for, upon controlling the setpoint force, controlling the modulation frequency to optimize an output signal strength of the output si gnat.

12. The atomic force microscopy system according to claim 9, wherein the transducer is arranged for applying the vibration signal to at least one of the group consisting of:
    the probe to apply the acoustic vibration signal to the semiconductor element via the probe tip; and
    the semiconductor element via a contact surface located underneath the semiconductor element, on an upper side of the semiconductor element or to the side of the semiconductor element.

13. The atomic force microscopy system according to any of the claim 9, wherein the control system further comprises at least one of the group consisting of:
    a low pass filter that filters the output signal for providing the first fraction;
    a high pass filter filters the output signal for providing the second fraction; and
    a locking amplifier that receives and processes the second fraction of the output signal to map a position dependent contact stiffness indicative of a binding strength at a measurement depth below the surface of the semiconductor element.

14. A method of manufacturing a semiconductor element or a semi-manufactured semiconductor element, comprising:
    depositing a self-assembled monolayer onto at least one of a substrate or one or more device layers, and
    performing a defect detection method on or a characterization of a layer of the semiconductor element or the semi-manufactured semiconductor element, the layer being a self-assembled monolayer or a directed self-assembled layer, the method being performed using an atomic force microscopy system, wherein the system comprises a probe with a probe tip, and wherein the system positions the probe tip relative to the semiconductor element to enable contact between the probe tip and a surface of the semiconductor element for performing the defect detection on or the characterization of the semiconductor element, wherein the system further comprises a sensor for sensing a position of the probe tip and for providing an output signal, the defect detection method comprising:
    scanning the surface of the semiconductor element with the probe tip;
    applying, using a transducer, an acoustic vibration signal to the semiconductor element;
    obtaining, from the sensor, the output signal that is indicative of the position of the probe tip during said scanning, the output signal including a first fraction and a second fraction; and
    monitoring a probe tip motion during the scanning for mapping the surface of the semiconductor element, and using the second fraction of the output signal for mapping a position dependent contact stiffness indicative of a subsurface elasticity and thereby indicative of a binding strength at a measurement depth below the surface of the semiconductor element, and
    wherein the second fraction of the output signal at least includes an output signal components having a frequency above a threshold frequency of the second fraction.

15. The method according to claim 14, further including, after deposition and defect detection or characterization of the self-assembled monolayer, performing, in order to form device structures of the semiconductor device, at least one of the group consisting of:
    selective atomic layer deposition, and selective etching.

* * * * *